United States Patent
Andle et al.

(10) Patent No.: US 11,448,682 B2
(45) Date of Patent: Sep. 20, 2022

(54) TRENDING FUNCTIONS FOR PARTIAL DISCHARGE

(71) Applicant: Rosemount Inc., Shakopee, MN (US)

(72) Inventors: Jeffrey Charles Andle, Rockledge, FL (US); Jonathan P. Murray, Chelmsford, MA (US); David J. Lane, Beverly, MA (US); Thomas M. Cunneen, Beverly, MA (US)

(73) Assignee: ROSEMOUNT INC., Shakopee, MN (US)

( * ) Notice: Subject to any disclaimer, the term of this patent is extended or adjusted under 35 U.S.C. 154(b) by 1137 days.

(21) Appl. No.: 15/910,106

(22) Filed: Mar. 2, 2018

(65) Prior Publication Data

US 2018/0252760 A1    Sep. 6, 2018

Related U.S. Application Data

(60) Provisional application No. 62/619,599, filed on Jan. 19, 2018, provisional application No. 62/466,105, filed on Mar. 2, 2017.

(51) Int. Cl.
*G01R 31/14* (2006.01)
*G01R 31/12* (2020.01)
*H02H 1/00* (2006.01)

(52) U.S. Cl.
CPC ......... *G01R 31/14* (2013.01); *G01R 31/1227* (2013.01); *G01R 31/1272* (2013.01); *H02H 1/0015* (2013.01)

(58) Field of Classification Search
CPC ................ G01R 31/12; G01R 31/1227; G01R 31/1263; G01R 31/1272; G01R 31/14; H02H 1/0015
See application file for complete search history.

(56) References Cited

U.S. PATENT DOCUMENTS

| 3,938,034 A | 2/1976 | Japenga |
| 4,904,996 A | 2/1990 | Fernandes |

(Continued)

FOREIGN PATENT DOCUMENTS

| CA | 2 192 856 | 9/2000 |
| CA | 2 455 206 | 5/2012 |

(Continued)

OTHER PUBLICATIONS

"Ubiquitous, On-Line, Partial Discharge Trending", by J. Andle et al., Electrical Insulation Conference (EIC) San Antonio, TX, Jun. 2018, IEEE, 6 pgs.

(Continued)

*Primary Examiner* — Huy Q Phan
*Assistant Examiner* — David B Frederiksen
(74) *Attorney, Agent, or Firm* — Westman, Champlin & Koehler, P.A.

(57) ABSTRACT

A method of detecting a partial discharge in an electrical asset includes sensing of a discharge current in the electrical asset using a transducer and responsively providing a transducer output; processing the transducer output by comparing the transducer output to a baseline; calculating an accumulated amount by which the transducer output exceeds the baseline; decreasing the accumulated amount with time; detecting partial discharge in the electrical asset based upon the accumulated amount; and providing an output related to detected partial discharge. A partial discharge detection system for detecting a partial discharge in an electrical asset includes a transducer configured to receive a signal from the electrical asset generated due to an occurrence of partial discharging in the electrical asset and responsively providing a transducer output. Processing circuitry compares the transducer output to a baseline, calculates an accumulated amount by which the transducer output exceeds the baseline, (Continued)

decreases the accumulated amount with time, and detects partial discharge in the electrical asset based upon the accumulated amount. Output circuitry provides an output related to detected partial discharge.

53 Claims, 5 Drawing Sheets

(56) References Cited

U.S. PATENT DOCUMENTS

| | | | |
|---|---|---|---|
| 4,937,763 A | 6/1990 | Mott | |
| 5,063,931 A | 11/1991 | Leavitt | |
| 5,602,709 A * | 2/1997 | Al-Dabbagh | H02H 1/0015 361/85 |
| 5,612,930 A | 3/1997 | Hazony et al. | |
| 5,815,352 A | 9/1998 | Mackenzie | |
| 5,933,012 A | 8/1999 | Bengtsson et al. | |
| 6,002,260 A | 12/1999 | Lau et al. | |
| 6,124,680 A | 9/2000 | Shoji et al. | |
| 6,172,862 B1 | 1/2001 | Jonnatti et al. | |
| 6,297,642 B1 | 10/2001 | Shibahara et al. | |
| 6,424,162 B1 | 7/2002 | Rokunohe et al. | |
| 6,483,316 B2 | 11/2002 | Kato et al. | |
| 6,577,138 B2 | 6/2003 | Zuercher et al. | |
| 6,774,639 B1 | 8/2004 | Unsworth | |
| 7,071,701 B2 | 7/2006 | Roman et al. | |
| 7,577,535 B2 | 8/2009 | Anderson et al. | |
| 7,676,333 B2 | 3/2010 | Younsi et al. | |
| 7,912,660 B2 | 3/2011 | Anderson et al. | |
| 8,271,213 B2 | 9/2012 | Xu et al. | |
| 8,466,690 B2 | 6/2013 | Stewart et al. | |
| 8,929,036 B2 | 1/2015 | Nayak et al. | |
| 9,322,881 B2 | 4/2016 | Sakurai et al. | |
| 9,372,221 B1 | 6/2016 | Bierman | |
| 9,383,402 B2 | 7/2016 | Fukasawa et al. | |
| 9,733,285 B2 | 8/2017 | Kennedy et al. | |
| 9,753,080 B2 | 9/2017 | Andle et al. | |
| 10,379,151 B2 | 8/2019 | Daoudi et al. | |
| 10,444,273 B2 | 10/2019 | Ikegami et al. | |
| 2003/0093390 A1 | 5/2003 | Onoda et al. | |
| 2004/0109269 A1 * | 6/2004 | Kawate | H02H 1/0015 361/42 |
| 2004/0193303 A1 | 9/2004 | Fore, Sr. et al. | |
| 2005/0012507 A1 * | 1/2005 | Kaneda | G01R 31/343 324/536 |
| 2005/0035768 A1 | 2/2005 | Rabach et al. | |
| 2005/0194979 A1 | 9/2005 | Roman et al. | |
| 2006/0022679 A1 * | 2/2006 | Obata | G01R 31/346 324/551 |
| 2006/0095220 A1 * | 5/2006 | Vrba | A61B 5/245 702/104 |
| 2007/0059986 A1 | 3/2007 | Rockwell | |
| 2007/0121261 A1 * | 5/2007 | Sung | H02H 1/0015 361/42 |
| 2007/0272827 A1 | 11/2007 | Heo et al. | |
| 2008/0133154 A1 | 6/2008 | Krauss | |
| 2008/0204950 A1 | 8/2008 | Zhou et al. | |
| 2008/0309351 A1 | 12/2008 | Steward et al. | |
| 2009/0119035 A1 | 5/2009 | Younsi et al. | |
| 2009/0251308 A1 | 10/2009 | Schweitzer, III et al. | |
| 2010/0072355 A1 | 3/2010 | Schweitzer, III et al. | |
| 2010/0114392 A1 | 5/2010 | Lancaster | |
| 2010/0271152 A1 | 10/2010 | Sabah et al. | |
| 2010/0315065 A1 | 12/2010 | Durston | |
| 2011/0234215 A1 | 9/2011 | Ausserlechner | |
| 2011/0234362 A1 | 9/2011 | Koehler et al. | |
| 2011/0249370 A1 | 10/2011 | Nayak et al. | |
| 2012/0134058 A1 | 5/2012 | Pamer et al. | |
| 2012/0185185 A1 | 7/2012 | Bae et al. | |
| 2012/0248946 A1 * | 10/2012 | Shaver | E21B 43/121 310/68 B |
| 2012/0319703 A1 * | 12/2012 | Serra | G01R 31/1227 324/649 |
| 2013/0039377 A1 | 2/2013 | Kagiwada et al. | |
| 2013/0192376 A1 | 8/2013 | Zhou et al. | |
| 2013/0226479 A1 * | 8/2013 | Grosjean | G01R 31/12 702/58 |
| 2013/0234726 A1 | 9/2013 | Hobelsberger | |
| 2013/0271883 A1 * | 10/2013 | Chang | G01R 31/2851 361/56 |
| 2014/0270205 A1 | 9/2014 | Miller | |
| 2014/0336479 A1 * | 11/2014 | Ando | A61B 5/14551 600/310 |
| 2014/0347069 A1 * | 11/2014 | Krumpholz | G01R 31/52 324/541 |
| 2015/0015303 A1 | 1/2015 | Sakurai et al. | |
| 2015/0043310 A1 | 2/2015 | Maas et al. | |
| 2015/0160098 A1 | 6/2015 | Noda et al. | |
| 2015/0204936 A1 | 7/2015 | Fukasawa et al. | |
| 2015/0253362 A1 | 9/2015 | Louzir et al. | |
| 2015/0260778 A1 | 9/2015 | Park et al. | |
| 2015/0301102 A1 | 10/2015 | Daoudi et al. | |
| 2015/0317229 A1 | 11/2015 | Wade et al. | |
| 2016/0003900 A1 * | 1/2016 | Narayanan | G01R 31/318566 714/726 |
| 2016/0116520 A1 * | 4/2016 | Di Stefano | G06N 3/08 702/58 |
| 2016/0161543 A1 | 6/2016 | Andle et al. | |
| 2016/0209454 A1 | 7/2016 | McCammon et al. | |
| 2016/0209459 A1 | 7/2016 | Tozzi et al. | |
| 2016/0231375 A1 | 8/2016 | Roemer et al. | |
| 2016/0370420 A1 * | 12/2016 | Langley | G01R 31/52 |
| 2017/0038424 A1 | 2/2017 | Ikegami et al. | |
| 2017/0059643 A1 * | 3/2017 | Bierman | G01R 31/346 |
| 2017/0074920 A1 | 3/2017 | Di Stefano et al. | |
| 2017/0168024 A1 | 6/2017 | Dehghan Niri | |
| 2017/0193252 A1 | 7/2017 | Ehrhardt et al. | |
| 2018/0062003 A1 | 3/2018 | Luan et al. | |
| 2018/0097531 A1 | 4/2018 | Kummaraguntla | |
| 2018/0114688 A1 | 4/2018 | Qian | |
| 2018/0115144 A1 * | 4/2018 | Murnane | H02S 50/10 |
| 2018/0159310 A1 * | 6/2018 | Yang | H02H 1/0015 |
| 2018/0356357 A1 | 12/2018 | Samarao | |
| 2019/0250198 A1 | 8/2019 | Kubena et al. | |
| 2019/0383872 A1 | 12/2019 | Andle et al. | |

FOREIGN PATENT DOCUMENTS

| | | |
|---|---|---|
| CA | 2 821 795 | 7/2012 |
| CN | 1407345 | 4/2003 |
| CN | 102193052 | 9/2011 |
| CN | 203025311 | 6/2012 |
| CN | 102621377 | 8/2012 |
| CN | 202502197 | 10/2012 |
| CN | 102934308 | 2/2013 |
| CN | 103913663 | 7/2014 |
| CN | 104914358 | 9/2015 |
| CN | 106199362 | 12/2016 |
| CN | 205880182 | 1/2017 |
| CN | 106461721 | 2/2017 |
| CN | 106772170 | 5/2017 |
| CN | 107238811 | 10/2017 |
| CN | 211653042 | 10/2020 |
| DE | 26 41 047 | 3/1978 |
| DE | 10 2015 113804 | 2/2017 |
| EP | 0 061 254 | 10/1985 |
| EP | 1 566 646 | 8/2005 |
| EP | 1 222 472 | 8/2006 |
| EP | 2 063 276 | 5/2009 |
| EP | 2 437 075 | 4/2012 |
| EP | 2 24 364 | 5/2012 |
| EP | 2 324 364 | 5/2012 |
| EP | 2 608 338 | 6/2013 |
| EP | 2 763 259 | 6/2014 |
| EP | 3 121 610 | 1/2017 |
| EP | 3 141 911 | 3/2017 |
| FR | 1 181 357 | 6/1959 |
| GB | 2 321 713 | 5/1998 |
| JP | 5-107301 | 4/1993 |
| JP | 3082132 | 8/2000 |
| JP | 2002-131366 | 5/2002 |
| JP | 2004-61358 | 2/2004 |

(56) References Cited

FOREIGN PATENT DOCUMENTS

| | | |
|---|---|---|
| JP | 2011-095036 | 5/2011 |
| JP | 4840050 | 12/2011 |
| KR | 10-2013-0060442 | 6/2013 |
| KR | 10-1280763 | 7/2013 |
| KR | 10-1285146 | 7/2013 |
| RU | 2 483 315 | 5/2013 |
| TW | 201 340 135 | 10/2013 |
| WO | WO 2007/070942 | 6/2007 |
| WO | WO 2013/038210 | 3/2013 |
| WO | WO 2013/124886 | 8/2013 |
| WO | WO 2013/131948 | 9/2013 |
| WO | WO 2013/136793 | 9/2013 |
| WO | WO 2013/139131 | 9/2013 |
| WO | WO 2014/053187 | 4/2014 |
| WO | WO 2017/053187 | 4/2014 |
| WO | 2014/189975 | 11/2014 |
| WO | WO 2017-029415 | 2/2017 |

OTHER PUBLICATIONS

"Using Continuous Temperature Monitoring to Avoid Critical Asset Failure" by J. Andie et al., Electric Light & Power, Jul. 2015, 7 pgs.
"Partial Discharge Testing: A Progress Report" by V. Warren, PD Progress Report, IRMC 2013, 11 pgs.
"Analytics Use Cases and Foundational Components", IEEE BDA Webinar Series: Big Data & Analytics for Power Systems, Dec. 8, 2017, 12 pgs.
Invitation to Pay Additional Fees from PCT/US2018/057461, dated Jan. 23, 2019.
"Preventing Transmission Line Damage Caused by Ice with Smart On-Line Conductor Monitoring", by N. Gubeljak et al., IEEE, 2016, 10 pgs.
"Dynamic Thermal Ratings Realize Circuit Load Limits", by D. Douglass et al., IEEE Computer Applications in Power, 2000, 8 pgs.
"Real-Time Monitoring and Dynamic Thermal Rating of Power Transmission Circuits", by D. Douglass et al., IEEE Transactions on Power Delivery, vol. 11, No. 3, Jul. 1996, 12 pgs.
"Network Planning Evaluation Implementing Time Varying Thermal Ratings", by A. Kapetanaki et al., IEEE, 2014, 6 pgs.
"Electrothermal Coordinating in Cable Based Transmission Grids", by R. Olsen et al., IEEE Transactions on Power Systems, vol. 28, No. 4, Nov. 2013, 8 pgs.
Notification of Transmittal of the International Search Report and the Written Opinion of the International Searching Authority from PCT/US2015/064385, dated Mar. 30, 2016.
"Advanced Measuring System for the Analysis of Dielectric Parameters including PD Events", by Lemke et al, Electrical Insulation Conference and Electrical Manufacturing & Coil Winding Conference, Oct. 1999.
Office Action from U.S. Appl. No. 14/961,321 dated Jan. 10, 2017.
Office Action from U.S. Appl. No. 16/227,478, dated Feb. 5, 2020.
"Partial Discharge Theory and Applicants to Electrical Systems", by G. Paoletti et al., IEEE IAS Pulp and Paper Industry Conference in Seattle, WA, 1999.
"Advantages of Continuous Monitoring of Partial Discharges in Rotating Equipment and Switchgear", by C. Kane et al., 8 pgs.
"Continuous Partial Discharge Monitoring with Assessed Condition Trending System (ACTS)", by C. Wendel et al., Cigre-Mexico, 2001.
"Ubiquitous UHF Monitoring System for Partial Discharge Detection and Trending", by J. Andle et al., IEEE, 2015.
Oil, Gas, and Petrochemicals Users Group Meeting, 2012, 2 pgs.
Ameren Illinois Smart Grid Test Bed Evaluation, by B. Snyder et al., Nov. 1, 2017.
Notification of Transmittal of the International Search Report and the Written Opinion of the International Searching Authority from PCT/US2018/020585, dated Jun. 25, 2018.
Notification of Transmittal of the International Search Report and the Written Opinion of the International Searching Authority from PCT/US2018/057461, dated Apr. 18, 2019.
Notification of Transmittal of the International Search Report and the Written Opinion of the International Searching Authority from PCT/US2019/018392, dated Jun. 3, 2019.
Office Action from Chinese Patent Application No. 201880000347.2, dated Feb. 2, 2021.
Notification of Transmittal of the International Search Report and the Written Opinion of the International Searching Authority from International Application No. PCT/US2019/027669, dated Jul. 23, 2019.
Communication from European Patent Application No. 18712051.4, dated Sep. 18, 2019.
Office Action from Chinese Patent Application No. 201920428356.3, dated Nov. 7, 2019.
Notification of Transmittal of the International Search Report and the Written Opinion of the International Searching Authority from International Application No. PCT/US2019/053726, dated Dec. 17, 2019.
Office Action from Chinese Patent Application No. 201880000347.2, dated Aug. 4, 2021.
Office Action (including translation) from Chinese Application No. 201920428356.3, dated Apr. 10, 2020.
Office Action from Chinese Patent Application No. 201880000347.2, dated May 28, 2020 including partial translation.
Office Action from Chinese Patent Application No. 201880000347.2, dated Feb. 2, 2021, English Summary.
Office Action from Chinese Patent Application No. 201910256390.1, dated Apr. 2, 2021.
Office Action from U.S. Appl. No. 16/232,194, dated Apr. 27, 2021.
Office Action from U.S. Appl. No. 16/580,251, dated May 14, 2021.
Office Action from U.S. Appl. No. 16/580,251, dated Sep. 8, 2021.
Office Action from Chinese Patent Application No. 201910256390.1, dated Aug. 12, 2021.
Communcation from European Patent Application No. 18712051.4, dated Aug. 10, 2022.

\* cited by examiner

TRENDING FUNCTIONS FOR PARTIAL DISCHARGE

CROSS-REFERENCE TO RELATED APPLICATION

The present application is based on and claims the benefit of U.S. provisional patent application Ser. No. 62/466,105, filed Mar. 2, 2017, and U.S. provisional patent application Ser. No. 62/619,599, filed Jan. 19, 2018, the content of which are hereby incorporated by reference in their entirety.

BACKGROUND

Partial discharge (PD) is a type of defect in medium voltage and high voltage electrical insulation wherein portions of the insulator volume fail at a critical electric potential, resulting in progressive damage to the insulation and eventual complete breakdown.

There is an increasing awareness of the role partial discharge monitoring plays in extending the operational life of electric power assets. For years, high value assets have undergone a periodic, off-line testing regimen; however, these tests are cost-prohibitive for the large numbers of transmission and distribution assets or even the electrical balance of plant equipment at generation facilities. While partial discharge is a leading (as opposed to lagging) indicator of insulation failure, it is not consistently present. Because of this, periodic tests frequently miss failures that evolve faster than the testing period or transient conditions that are absent at testing.

One technique for monitoring equipment involves the use of trending the intensity of the partial discharge activity (the total discharge integrated over a power cycle). It has been observed that the activity exhibits an increase and then a drop before final failure. The drop is often accompanied by a temperature rise, which is typically considered to be a lagging indicator of partial discharge. Other failure curves are known in the art. The majority of these are affected by the intermittent nature of PD.

Ideally, a trend with a smoothly varying intensity function—albeit not monotonic could be used. However, in practice, PD activity can be far less consistent. Partial discharges may initially occur only at extremes of environment, for example, or only during over voltage transients in the power system. By the time a smoothly varying intensity function evolves, the asset may already be heavily damaged. Data collection may also be intermittent.

There are challenges associated with trending such intermittent events to obtain actionable, predictive information. These challenges are further complicated because switching events in the generation, transmission, and distribution network might be seen as "partial discharge" by some systems even though the switching arcs have nothing to do with insulation failure.

The problem is further complicated for intermittently used assets, such as peak power generator assets, backup generator assets, spare or auxiliary circuits, etc.

SUMMARY

A method of detecting damage caused by partial discharge in an electrical asset includes sensing of a signal responsive to partial discharge activity such as high frequency spikes of the line current or line voltage in the electrical asset using one or more transducers and responsively providing one or more transducer outputs that are related to the instantaneous partial discharge activity; optionally preprocessing the transducer outputs by rejecting events with a time duration less than a threshold time; processing the transducer outputs by comparing the transducer outputs to their baselines; accumulating the amounts by which the transducer outputs exceed the baselines at each sample; decreasing the accumulated amounts with time; predicting the accumulated damage to the electrical asset from partial discharge based upon the accumulated amount; and providing an output related to damage in the electrical asset. A system for detecting a partial discharge in an electrical asset includes one or more transducers configured to receive one or more signals from the electrical asset generated due to an occurrence of partial discharge in the electrical asset and responsively providing one or more transducer outputs. Processing circuitry compares the transducer outputs to baselines, calculates accumulated amounts by which the transducer outputs exceeds the baselines, decreases the accumulated amounts with time, and detects damage caused by partial discharge in the electrical asset based upon the accumulated amount. Output circuitry provides an output related to damage caused by the detected partial discharge activity.

DETAILED DESCRIPTION OF ILLUSTRATIVE EMBODIMENTS

Figure 1:
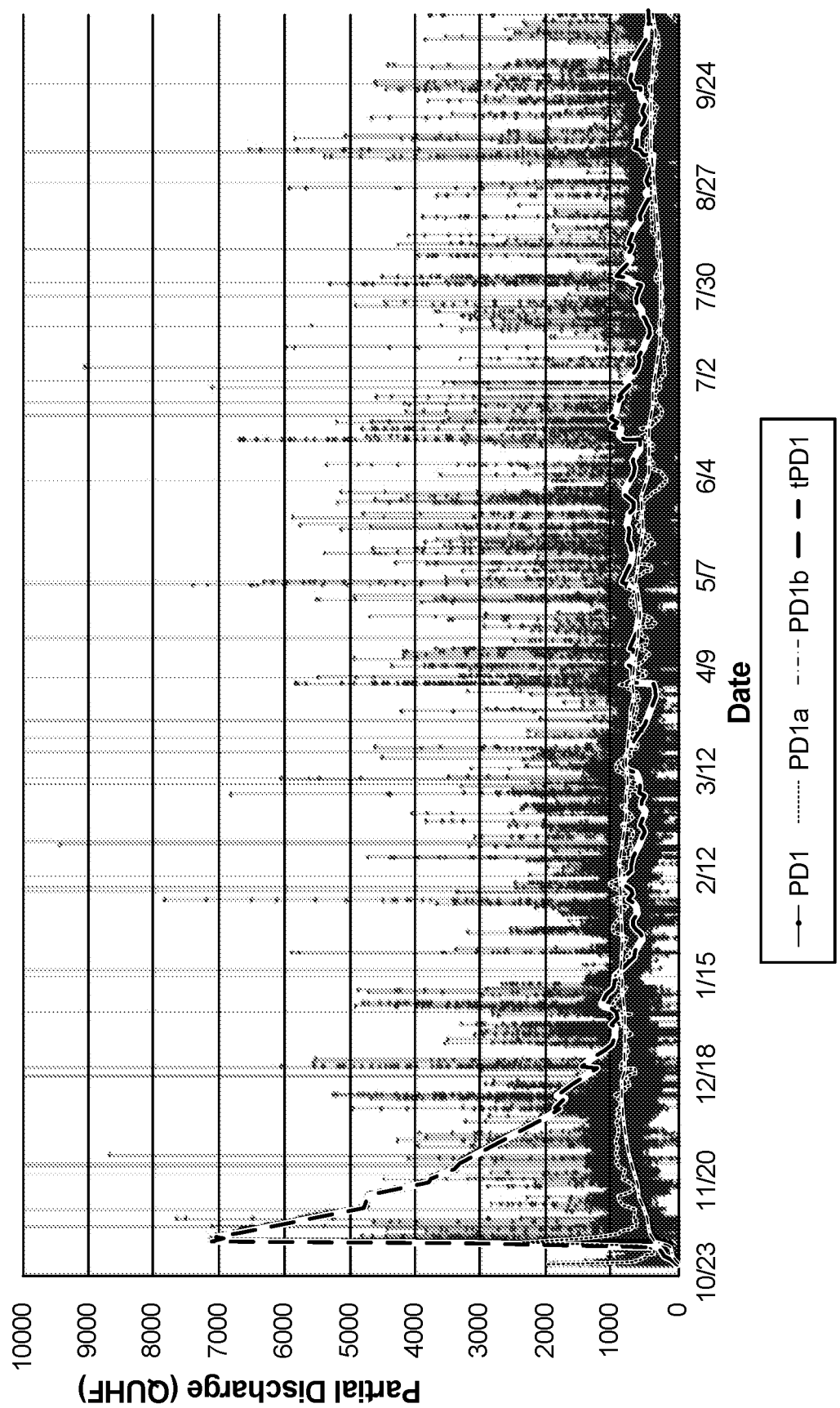
FIG. 1 is a graph which illustrates partial discharge occurrences in process data.

Partial Discharge (PD) monitoring has been proven to improve and extend the life of large, high value, centralized assets, providing maintenance and reliability teams the ability to justify the cost of traditional PD monitoring equipment and the complexity of expert analysis. More recently, PD monitoring has been steadily transitioning from periodic, off-line testing to continuous, on-line monitoring, and innovative, lower-costs solutions have begun permeating the electric power network.

On the generation side, this is resulting in ubiquitous monitoring in the electrical balance of plant (EBOP) switchgear, motor control centers, bus ducts, and step-up, auxiliary, and instrumentation transformers, in addition to the brushes and cable terminations of the generator itself. On the transmission and distribution side, this is resulting in the monitoring of switchgear, capacitor banks, and buried cables. In addition, there is a growing demand to monitor critical power assets at the end use point, such as data centers, hospitals, airports, petrochemical and metal-working plants.

In one aspect, this invention relates to applying layered processing to extract meaningful information from real-time, on-line partial discharge signals, allowing asset health estimations from a highly reduced data stream consistent with distributed control systems.

One objective of the present invention is to provide techniques which use calculations and filtering processes on a stream of live or historical data to provide a suitable transformation function by which to trend partial discharge damage. The functions preferably:

Filter out short-lived events with a duration less than $(M-1)\tau_{bin}$, where $\tau_{bin}$ is a sample window time and M is the number of sample bins used to filter, to avoid switching transients while keeping events with a duration greater than $M\tau_{bin}$.

Consider only events with intensity greater than a long-term baseline, $\beta(d)$, for datastream, d.

Accumulate a trend function, $T(d, \beta(d))$, of the datastream, d, and baseline, $\beta(d)$, indicative of progressive worsening of asset health.

Dissipate the accumulated trend function, $T(d, \beta(d))$, to avoid infinite duration summations of old, potentially irrelevant, data.

Optionally suppress the dissipation of the accumulated trend function, $T(d, \beta(d))$, and the, baseline $\beta(d)$, when an asset is not energized or when partial discharges are externally induced, such as for built-in self-test.

The present invention is based on a number of premises. These include:

That short lived transient events should not contribute to the trending function.

That the rate of increase above a baseline is more significant than the baseline itself.

That damage is cumulative and that an increase of cumulative damage causes an increase in the severity of partial discharge.

That discharges sufficiently in the past that have not cumulated past a threshold are assumed to have less significance than recent events.

That all trending functions should be "paused" when an asset having intermittent use is not energized or is having discharges induced for testing.

These premises, in part, derive from a consideration of the nature of partial discharge. The first premise is based on the previous observation that switching events sustain a brief arc between the opening or closing of contacts that is short in duration but high in magnitude. A process to eliminate such collections of samples in the data stream are herein collectively referred to as decimation, because a preferred scheme for accomplishing this task involves resampling the data. Decimation includes one or more of pre-averaging, under-sampling, filtering, and post-averaging; however, the filtering step is the primary goal of decimation. While there are a number of methods that can be used for filtering short, large events from a data-stream, one such decimation method is computationally simple and readily implemented in low cost, local measurement electronics.

Readings, r, of datastream d(t), are taken at discrete time, t, and averaged over a time window, $\tau_{bin}$, to obtain binned, averaged, raw data, $R_i(i^*\tau_{bin})$. Time window, $\tau_{bin}$, is not necessarily an integral multiple of the raw data sample intervals, nor are the samples, r, in the raw data necessarily uniformly sampled. The simplest implementations will have uniformly sampled $R_i(i^*\tau_{bin})$ after decimation; however, aperiodic sampling after decimation is still consistent with the goals of the present invention.

The scale of $M\tau_{bin}$ should be longer than a switching transient (tens of milliseconds to a few seconds) but shorter than line overvoltage conditions. UL61010-1 and IEC 60364-4-44 suggest AC MAINS transients to include short term temporary overvoltages on low voltage AC MAINS of four times the nominal line voltage for 5 s. It also suggests short term temporary overvoltages on low voltage AC MAINS of smaller magnitude for longer duration. These overvoltages directly result from overvoltage conditions on high voltage and medium voltage transmission and distribution networks, so it is reasonable to assume that large voltage transients causative to partial discharge damage in electric power assets exist for at least 1-5 seconds. An exemplary range for $M\tau_{bin}$ is between 1 and 10 seconds. If the sampling rate is slower than this, it may be preferable not to use decimation for filtering. The decimation scheme examines M trailing bins and selects a bin value that is not the largest bin value from amongst $R_i(i^*\tau_{bin})$, $R_{i-1}(i-1)^*\tau_{bin})$, . . . , $R_{i-M}((i-M)^*\tau_{bin})$, to be used as $D_i(i^*\tau_{bin})$. In the preferred embodiment, the smallest bin value of the M trailing values is selected.

There exist numerous schemes for accumulating the raw data, r, including but not limited to box-car averages (optionally with discarded outliers), exponential averages, finite impulse response (FIR) and infinite impulse response (IIR) filter functions, integrals, medians, means, minima, maxima, and the like. The salient aspect is that a single accumulated value representing the data over the time is obtained.

A trending function, $T_j(Nj\tau_{bin})=T(R(t), \beta(t))$, is updated at a period, $t=N\tau_{bin}$ and N is an undersampling factor, after which one of the cumulative readings in the past M time window bins is selected. Decimation of $R_i(i^*\tau_{bin})$ over M samples is preferably used to obtain decimated data, $D_i(i^*\tau_{bin})$. By selecting the lowest value in the past M readings for the decimation, only consistently active discharges are brought into the trending function, while transient switching events are easily ignored. In at least one embodiment N=1 and M>1. Preferably M>2 to avoid contributions from transients that straddle the time-slice boundaries. An exemplary case is a bin time of 0.1 to 10 seconds, taking the smallest of M=3 trailing bins, and sampling every bin (N=1). Suitable trending has been obtained with even a 60 second binning time and three bins; however shorter binning times are preferred.

Longer values of M would tend to miss significant, short-lived events while most completely avoiding unwanted events. An exemplary case is M=3, which requires an event to persist for a duration of $3\tau_{bin}$ in order to have any effect.

The preferred embodiment uses N=1; however, it could be desirable to undersample the trended data for data reduction. In the case where N>M, the values of $T_j(Nj\tau_{bin})$ could use only the most recent M sample decimation, $D_j(jN^*\tau_{bin})$, or they could average or integrate the trailing M-sample decimation, average($D_{j-N}((j-N)^*\tau_{bin}):D_j(j^*\tau_{bin}))$, over the N decimated samples.

The value of $\tau_{bin}$ should be slightly longer than the opening or closing times of switches in the electrical network. While taking the minimum value of a series of M values of $R_i(i^*\tau_{bin})$ will always ignore a transient of width less than $(M-1)^*\tau_{bin}$ in duration in $D_j(j^*\tau_{bin})$, it may also miss important, though brief, events. Alternatives to using the minimum value include using the median value or averaging all but the largest two values (with M>3). Ignoring only the largest value is susceptible to switching events that start in one time bin and end in another.

Given that M=3 is an exemplary value, that power system standards suggest overvoltages with durations on the order of 5 seconds (overvoltages cause electric fields to locally exceed breakdown, resulting in PD), and switching is on the order of less than a second, a preferred range of $\tau_{bin}$ is between about 0.5 and 1.5 seconds. Shorter intervals will capture one second switching transients to some extent in all three bins, causing false positives. Longer intervals will not capture 5 second overvoltage events in all three bins and will miss early causes of insulation damage.

In many cases, data cannot be sampled this fast and the detector may be implemented with a quasi-peak sample and hold mechanism to prolong detected events. In this case $\tau_{bin}$ should not be less than half the hold time.

In other cases, the data may already be undersampled. In this case decimation might be skipped in a less ideal implementation.

To address the concerns of this premise, an optional step in the method of the present invention is to decimate the incoming data using a comparison of trailing time slices, such that the largest time slice (bin) values are discarded and transient events of a duration shorter than the time slice do not contribute to the trending function.

In another possible embodiment, n samples are averaged to form an undersampled, averaged datastream, d'(t), with $\tau_{bin}=n\tau_{sample}$. In this embodiment, the trend function, $T_k(kN\tau_{samp})$, is updated every nN samples of d(t). Non-periodic input data could also be binned with $\tau_{bin}>\tau_{sample}$, and $T_k(kN\tau_{bin})$ being a uniformly updated output function.

The steps and parameters related to pre-averaging, under-sampling, filtering, and post-averaging may be chosen and applied as desired within the process of decimation.

The second premise is based on the observation that the discharge itself is less significant than the progressive damage that it inflicts on the insulation. The process of discharging within insulation damages the insulating material and causes progressively larger discharge under equivalent overvoltage conditions and equivalent discharges under progressively smaller overvoltages. Even though the instantaneous magnitude of partial discharge may rise and fall with changing operating conditions, there will be a trendable combination of intensity, duration, and frequency of occurrence that grows exponentially for at least one portion of the asset's lifetime. One ideal trending function should evaluate the amount by which the decimated level of discharge, $D_j(k*\tau_{bin})$, is above some historical average baseline, $\beta(j*\tau_{bin})$, on the premise that the equipment has withstood that baseline level of discharge without failure for the averaging time of the baseline function.

In order to minimize computational burden and storage requirements, an exponential average, $\exp(-\beta t)$, is preferred; however, a multi-point simple or weighted average may offer advantages and is increasingly tractable with modern embedded computer chips. The period of this average is a matter of technical choice; however, it should preferably be, at a minimum, several days and as much as 7-100 days. If the period is too short, then the average baseline will not reflect a proper average of short-lived and intermittent events. If it is too long, then a baseline will not evolve to subtract from the subsequent events and a trending function will quickly escalate. In any case, the averaging period is much greater than $\tau_{bin}$.

On the other hand, the instantaneous value of discharge may not be of specific consequence. Different asset classes may tolerate stronger discharge levels before the onset of progressive, run-away damage. Different measurement techniques may result in different numerical scales for the same physical partial discharge activity. Preferably, the trending function should only evaluate the growth of discharge, above such a baseline average. To address these observations, the decimated value, $D_j(j*\tau_{bin})$, and the average baseline, $\beta$, are employed to obtain the increase, $\Delta_j(j\tau_{bin})=\max(0, D_j(j*\tau_{bin})-\beta)$.

It may be desirable to include other offsets, in addition to $\beta$, in $\Delta_j(j\tau_{bin})$, including offsets proportional to a statistical property of the raw data, such as a standard deviation, or offsets proportional to the ambient noise—either measured or assumed—of the signal.

In a preferred embodiment, the signal from one asset is compared to the signals from one or more neighboring assets. Because the assets are interconnected on the electrical grid, signals from one or more neighboring pieces of equipment may be detected in the target asset, even though the damage occurs in the neighboring system. In this case, the neighboring signals could be used as a threshold, below which the target asset's signal is not accumulated. Alternately the signals from one or more neighboring assets may be incorporated into the offset, along with the average baseline, $\beta$.

In order to address the variability of assets and instruments, it is also desirable to normalize the result. In one embodiment, the normalization could employ a scale factor, obtained through user input or machine learning. In a more preferred embodiment, normalized data is obtained by normalizing to a function of the baseline. In a generalization, the difference is taken as the decimated value minus one function of the baseline (which may also include one or more offsets) and the positive differences are normalized by a second function of the baseline, $$\Delta_j(j\tau_{bin})=(D_j(j\tau_{bin})-f_1(\beta))/f_2(\beta); D_j(j\tau_{bin})>f_1(\beta) \qquad \text{EQ. 1}$$

Other similar equations may be used in alternate embodiments to normalize the trending function to the average baseline. In either case, the value is assumed to be zero if $D_j(jM*\tau_{bin})<\beta$ or $D_j(jM*\tau_{bin})<f_1(\beta)$. It is assumed that this increase represents new damage, and is causative of new damage, but that decreases in activity do not represent "self-healing". In an exemplary case, $f_1(\beta)=f_2(\beta)=\sqrt{(\beta^2+\beta_o^2)}$, where $\beta_o$ is a typical noise floor of the installation. Normalizing against the baseline adjusts the trend function to be relative to the long term, stable operation of the system. Other possible values for $\beta_o$ include a term proportional to the standard deviation of the raw data, decimated data, or averaged data.

In a preferable embodiment, in which the partial discharge in neighboring assets is used to reduce false assessments of damage in the present asset, $f_1(\beta)$ has a term that is a function of the signals from the neighbors, $F(R_{neighbors})$. This could be a weighted sum of the raw or decimated data from the neighbors, or a term proportional to the maximum value of the neighbors.

In some embodiments, periodic calibration pulses, either using built-in self-test or external processes, might be used to evaluate the sensitivity of the target asset and the crosstalk between assets. The result of these measurements could be used in determining weighting coefficients for using neighboring asset signals in an aggregated offset value to reduce cross talk. They could also determine at least a component of the offset and normalization functions.

The steps of decimation and of detecting an increase may occur in either order, since the average is taken over a much longer period than the time slice interval, $\tau_{bin}$. Data that is not normalized may still convey quantitative information; however, it might be easier to set alarms on a normalized trending function over a wider range of asset types. In the exemplary case, decimation precedes detecting an increase.

The third premise, that damage is cumulative, is incorporated into the method of the present invention by integrating or taking a sum of the positive values of $\Delta_j(j\tau_{bin})$ to obtain the trending function, T. Since the preferred methods of measurement employ intelligent electronic devices (IEDs) in Smart Grid infrastructures and provide discrete, quantized, time slices, a summation is used in a more preferred embodiment. In a most preferred embodiment, the summation is adjusted for the time scale of the bins so that the magnitude of the trending function does not vary excessively with sampling rates. One exemplary scaling factor to compensate the trending curves over bin time is to accumulate $$(1-\exp(-\delta))*\Delta_j(j\tau_{bin})$$

which is numerically equivalent to $\delta\Delta_j(j\tau_{bin})$ for sufficiently long time constants, $\delta$. Typically $\delta$ is proportional to $\tau_{bin}$, making the summation a discrete approximation of an integral.

The fourth premise provides that recent events are more meaningful than past events, since past events have not already caused failure or a sufficiently rapid increase in the decimated raw data, $D_j(j^*\tau_{bin})$, compared to its average, $\beta$, or the function, $f_1(\beta)$. This attribute of the invention is addressed by employing a suitably long damping factor, $\gamma_{function}(t)$ on the trending function, T. In an exemplary method, $\gamma_{function}(t)=\exp(-\gamma t)$ and $T(t_{new})=T(t_{old})*\gamma_{function}(t_{new}-t_{old})+\Delta_j(h\tau_{bin})$. The exemplary case is $T(t_{new})=T(t_{old})*\exp(-\gamma(t_{new}-t_{old}))$ $(t_{new}-t_{old})+\exp(-\gamma(t_{new}-t_{old}))\Delta_j(j\tau_{bin})$. In one exemplary case, $\gamma=1/(14\text{ days})$ and the time constant of the baseline is also 14 days.

A trending function is therefore obtained from a series of discrete data samples that uses a windowing scheme for decimation of samples that removes transient events on a timescale less than $2\tau_{bin}$, where $\tau_{bin}$ is ideally on the order of the mechanical switching time of electrical assets but may be limited by the sampling rate of the instrument. The algorithm further uses an integral or sum of the decimated samples that exceed a baseline average.

The sum or integral grows with a continuing excess of the decimated samples relative to the average, providing a response indicative of accelerating levels of discharge. The value simultaneously decays exponentially, or in some other gradual fashion, such that the trending function only increases when the acceleration of discharge exceeds a rate that outpaces the decay factor.

A fifth feature of the invention relates to intermittent use assets and suppresses changes in the functions when the system is not energized. In one such implementation, a SCADA or DCS system instructs the instrument when the asset is energized. In another, the instrument measures the voltage of the asset and determines whether the asset is energized. When the asset is not energized, updates to the decay term, $\gamma_{function}$, and baseline, $\beta$, are suspended. This prevents changes in either the baseline or the trend functions.

A related case addresses assets with built-in self-test or periodic on-line or off-line external tests. These tests include the use of calibrators to simulate partial discharge events or the application of over-voltage stresses to induce partial discharge under energy-limited conditions. These signals are used to confirm the operation of monitoring systems and/or to more accurately assess the health of the system, e.g. as a calibration signal, and the response to such artificial stimuli should be masked in the trending function, as there is no associated damage.

When the system, as discussed thus far, begins operation, the baseline is initially zero and all signals are above the baseline. This leads to a high initial false positive of the trend function that persists for about the time constant of the baseline average. In a preferred embodiment, the system is alerted that it is in startup mode and steps are taken to smooth the startup conditions. These steps may include: setting an initial baseline value, starting baseline computation with a very short time constant and increasing the time constant proportional to the cumulative run time until the nominal time constant is reached, or not accumulating any signals for an initial time proportional to the baseline time constant.

In a most preferred embodiment, the signal source is first classified using a pattern recognition algorithm. An exemplary algorithm scans electrical signals for several power frequency cycles, then outputs a value for the cumulative charge per cycle having corona-like signatures and the cumulative charge per cycle having internal defect type PD signatures, along with a remainder that is classified as noise. These are called noise, "SD" and "PD", where "PD" in the classification scheme is the portion symmetric in the polarity of the power voltage, characteristic of internal voids within the insulation, and "SD" is the portion that only occurs at one polarity and is characteristic of corona and other surface-to-air discharges. These outputs separate the sum of some number of discrete events into two outputs representing two different failure modes. This preprocessing is called classification and one classification process is described in U.S. Pat. No. 9,753,080 to Andle et al. Separate trending functions may then be updated for the resulting "SD" and "PD" outputs of the optional classification step.

Although other trending functions may be implemented, one specific technique is set forth below. While averaging data will remove the outliers with high amplitude and durations of only a few samples, it will also lose information about discharges of high magnitude that persist for minutes to hours. Short term, e.g. 1 day, averages are useful for correlating signals between locations; however, in terms of either alarming or trending, they ignore the necessary contributions of short-lived but large events that are a primary source of damage. The goal is to capture the effects of these chaotic events into a smoothly varying and readily compressible asset health variable for archiving.

One trending method first performs a decimation of the data when the sampling period is smaller than 60 seconds, for example. The decimation takes the smallest value of the previous three samples. This allows the algorithm to ignore switching events and lightning-induced transients.

The algorithm then calculates a deviation, $\Delta$, using the decimated value, D, and the baseline, $\beta$. When $D>\sqrt{(\beta^2+\beta_o^2)}$ $$\Delta(j\tau_{bin}) = \left(D_j(j\tau_{bin}) - \sqrt{\beta^2 + \beta_o^2}\right)/\sqrt{\beta^2 + \beta_o^2} \qquad \text{EQ. 2}$$

where $\beta o$ is a noise threshold (e.g. 100 to 1000), $\beta$ is the baseline average, and D is the decimated value being trended. Otherwise, $\Delta=0$. For baseline readings, $\beta$, that are significant compared to the noise floor, $\beta_o$, $\Delta$ is the fractional difference between the reading and the baseline. For situations where the baseline is near the noise floor, $\beta_o$ places a lower bound on the normalization factor, preventing unwanted "amplification" of raw data when the baseline is still smaller than the noise floor.

The algorithm next accumulates Δ into T, decaying with a period, 1/γ, currently to the time constant used to average the baseline, β. In an exemplary case, β is a 14 day average (D=14) and γ=1/(14 days).

$$T(i\tau_{bin}) = T((i-1)\tau_{bin})e^{-\tau_{bin}/D} + (\tau_{bin}/D)\Delta(i\tau_{bin}) \qquad \text{EQ. 3}$$

where $i\tau_{bin}$ is the sampling of the decimated samples.

FIG. 1 shows an example of the PD data collected over time. The raw PD data is shown as dots. The daily average (------*------) loses virtually all information on transient PD events, which may last only tens of seconds to several minutes in the early stages of insulation deterioration. These are important because, initially, new damage primarily occurs during transient overvoltage conditions or condensing humidity conditions. The former events are typically corrected in a matter of minutes by the grid control systems and the latter—initially—are quickly evaporated by the energy of the discharge. Another line (--*--*--*--) shows an exponentially weighted average baseline, called β. This baseline average is used in EQ. 3 to set a lower bound on the values of PD or SD that will contribute to trending. The β curve uses a long averaging time scale, P. Once settled from a step increase, the baseline is stable. In the plot, P is 14 days and β is exponentially averaged as $\beta_{new} = \exp(-dt/P)*\beta_{old} + (1-\exp(dt/P))*R(t_{new})$ and $dt = t_{new} - t_{old}$. Typically, $dt = \tau_{bin}$.

The deviation function, Δ, is normalized to the baseline, allowing the trend function to be applicable to a wide range of asset classes, defect types, and even trended variables. The settling time of the β baseline causes the initial elevated PD values to have a disproportionately high normalization of the deviation, Δ, and results in an overshoot 501 of the trend function, T, (--- --- - 501). This is partially addressed at start-up by employing an offset, $\beta_o$, in EQ. 1, presently $\beta_o = 500$. Having $\beta_o$ be proportional to the standard deviation or some other statistic of the decimated data may also be desirable, as would having it be proportional to signals from neighboring assets.

The overshoot can be further reduced at startup by using a variable time scale for the β average that smoothly transitioned from 0 to P. However, similar overshoots will occur on a step change in PD that might accompany changes in load, changes in asset health after a fault, etc. It may not be desirable to suppress these. A mechanism that sets a startup mode is desirable, in which the transient 501 could be suppressed, smoothed, or otherwise prevented.

Once β is stabilized, T rises when PD is becoming more significant and subsides when the PD activity is stable. Elevated T is intended to indicate an accelerating PD intensity over time. This assumes PD is only an operational threat if the discharges are causing new and progressive damage to the asset.

As the baseline settles toward the new PD levels, the trend function will decay toward zero. On the other hand, discharges that induce new insulation damage will tend to introduce new PD sites, tend to reduce the inception voltage of existing sites, and will generally increase the intensity of PD and the fraction of the time in which PD exists. This will raise T, indicating the new damage. If T subsides again, then it is assumed that the asset has reached a new, stable baseline. However, if T remains elevated or accelerates further, then the degree of damage has entered an exponential growth phase in which new damage is bringing the system perilously close to a fault condition.

Figure 2:
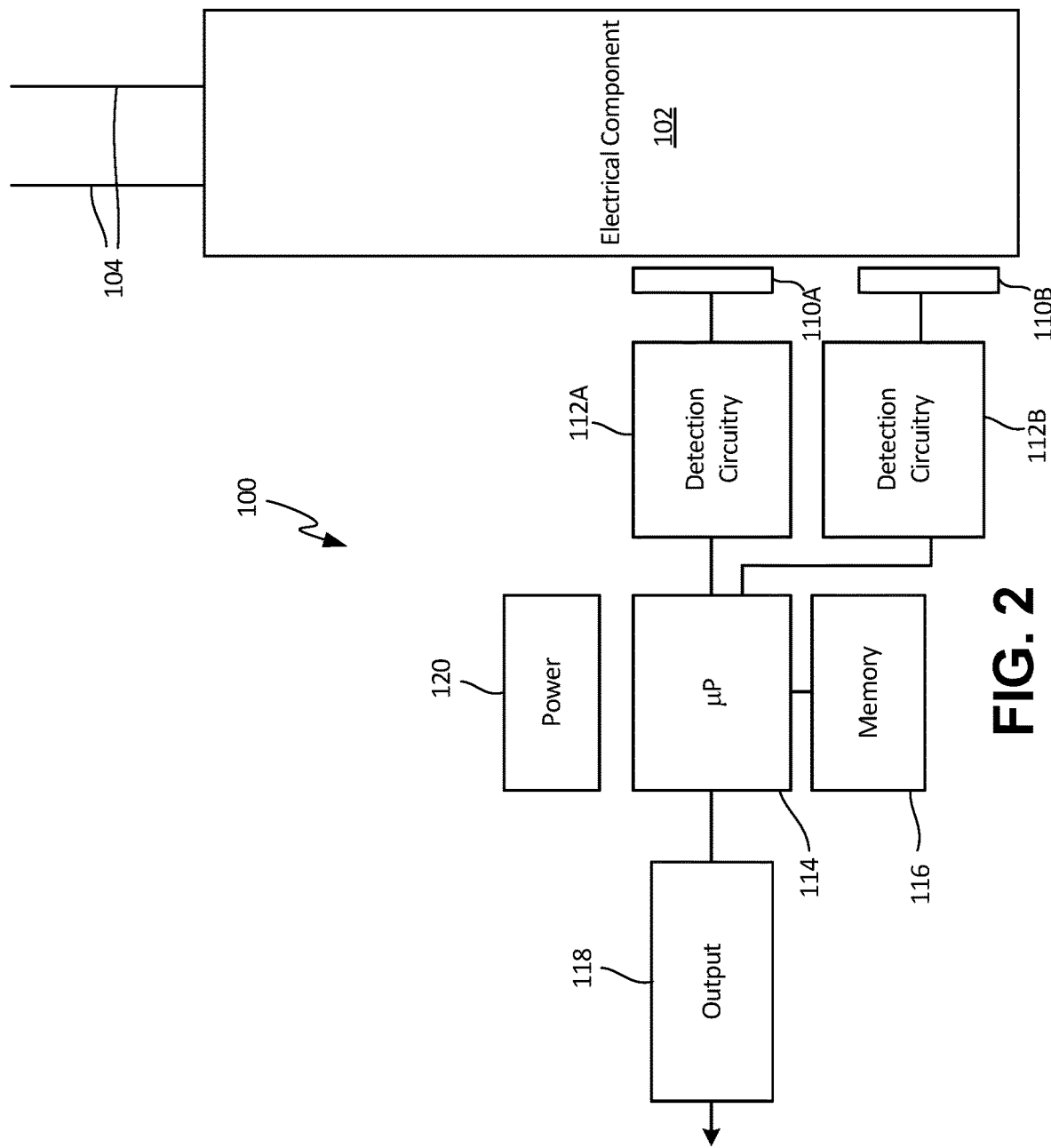
FIG. 2 is a simplified block diagram showing circuitry used to detect partial discharges in an electrical asset and determine a condition of the electrical asset using trending of such partial discharges.

FIG. 2 is a simplified block diagram of partial discharge detection system 100 arranged to detect partial discharges from electrical asset 102. The electrical asset 102 may be any appropriate electrical asset in which partial discharge events occur. The asset 102 is illustrated as being connected to a power grid 104.

In this embodiment, partial discharge detection system 100 includes a transducer 110 arranged proximate the electrical asset 102. The transducer 110 may be positioned within a housing of the asset 102 or may be positioned, in some configurations, external to a housing of asset 102. The transducer 110 may be in accordance with any appropriate technology including an antenna, capacitive contact, contact, transient earth voltage (TEV) probe, transient magnetic (TM) probe, induced charge (Q-dot) probe, or HFCT configured to receive radio frequency emissions, an acoustic or ultrasonic sensor, as well as an optical detector. Detection circuitry 112 is arranged to receive a signal from transducer 110 and provide a detected signal to a microprocessor 114. The detection circuitry 112 is configured to detect the signal from the transducer and may include an amplifier, filter or other components. In at least some implementations, multiple transducers are used 110B. These may share the same detection circuitry 112 or have their own detection circuitry 112B, or a mixture of independent and shared circuitry. They may output independently trended signals or the signals may be blended into an aggregate before trending. Microprocessor 114 operates in accordance with instructions stored in a memory 116. Microprocessor 114 provides an output using output circuitry 118 when a partial discharge event or a pattern of recurring partial discharge events is detected. A power supply 120 is illustrated and is used for powering circuitry of system 100. The power supply may be an internal power supply, for example, provided by a battery, or may be power received from an external source. Operation of the detection circuitry is described below in more detail.

Microprocessor 114 monitors the output from the detection circuitry 112 and optional circuitry 112B. Based upon the output from the detection circuitry 112 and optional circuitry 112B, the microprocessor can provide an output, for example locally to an operator using an annunciation technique such as an audible or visual output, or the information may be transmitted to a remote location such as a control room. In another example, the output 118 is used to shut down the electrical asset 102, or an upstream power source feeding the electrical asset 102, to prevent further damage. Most preferably the output would signal a level of urgency of future maintenance (predictive maintenance).

The output can also provide an indication of a corona discharge or the amount of noise present. The output might traditionally be based upon a number of events which are detected over a period of time, a frequency at which a number of events are detected, an amplitude or strength of one or more events, or some combination thereof; however, these parameters are not directly indicative of machine health. By outputting the trending function, a signal is obtained that encapsulates all of these parameters into one or more asset health trend function, which is immediately related to the accumulated damage and the rate at which damage is accumulating. An exemplary device scans electrical signals for several power frequency cycles, then outputs a value for the cumulative charge per cycle having corona-like signatures and the cumulative charge per cycle having internal defect type PD signatures. These are called "SD" and "PD". These outputs separate the sum of some number of discrete events into two outputs representing two different failure modes. As noted previously, this pre-processing is called classification and one classification process is described in U.S. Pat. No. 9,753,080 to Andle et al. Separate trending functions may then be updated for "SD" and "PD". This classification might occur in microprocessor 114 or in the detection circuitry 112 and 112B. The output signal may be output to a separate microprocessor or to a separate process within the same microprocessor for execution of the present invention.

Figure 3:
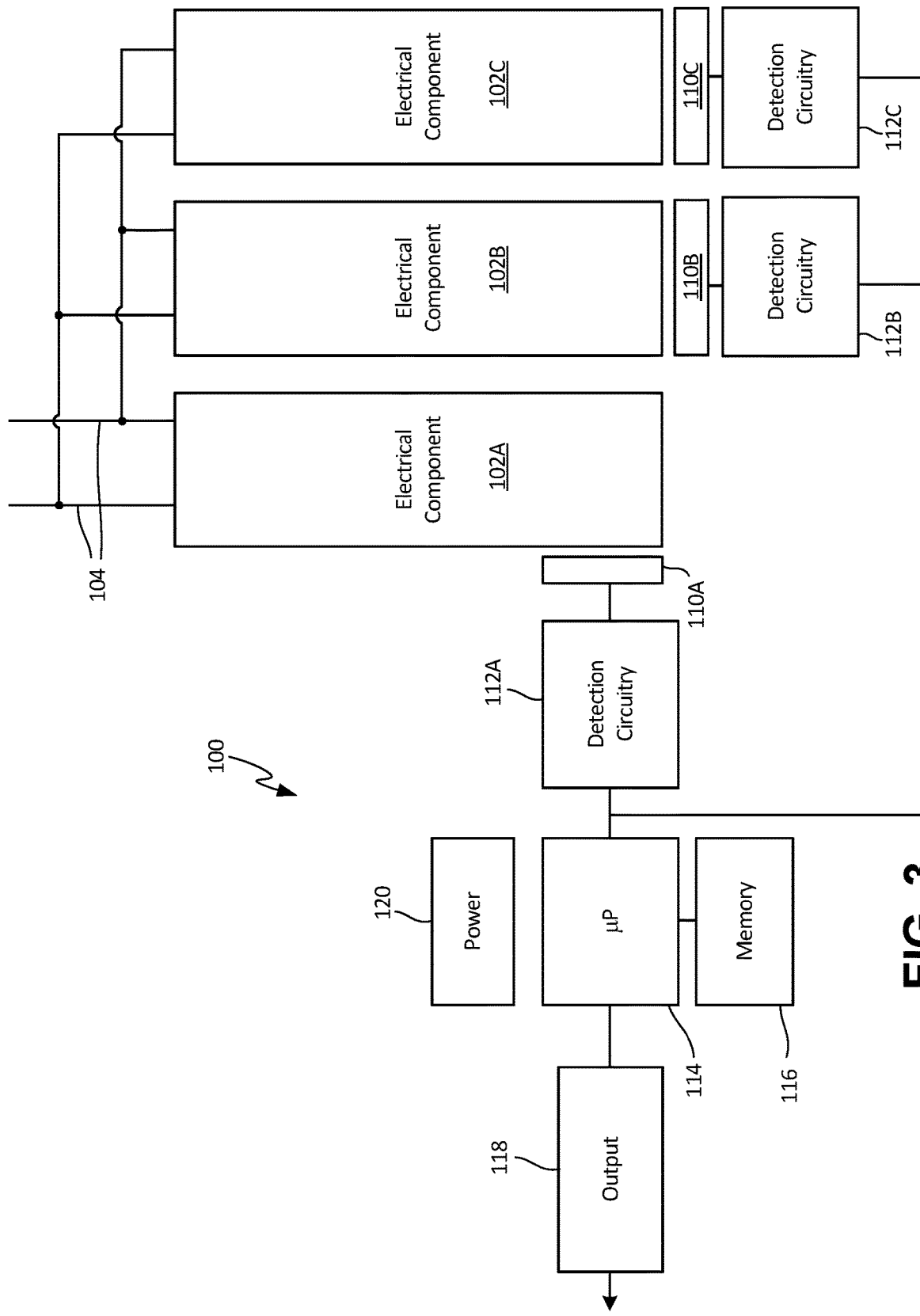
FIG. 3 is a simplified block diagram showing circuitry used to detect partial discharges in a target electrical asset while removing signal from partial discharges in neighboring electrical assets and determine a condition of the target electrical asset using trending of such partial discharges while ignoring signals from partial discharges occurring outside the target electrical asset.

Pursuant to another embodiment, FIG. 3 illustrates an improved system in which target electrical asset 102b has left and right neighbors, 102a and 102c. Each asset is measured by the associated transducer —110a, 110b, or 110c—and detection circuitry —112a, 112b, or 112c—and the microprocessor employs the signals from neighbors 102a and 102c to reject false positive signals conducted into asset 102b from external partial discharge events.

Figure 4:
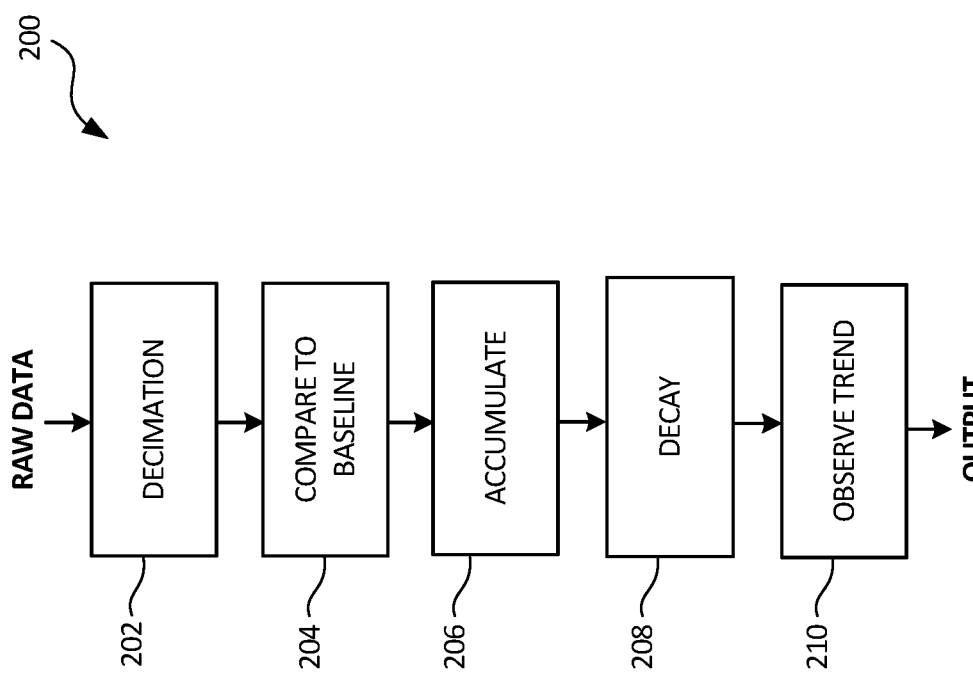
FIG. 4 is a simplified block diagram showing example steps used in determining changes in condition of an electrical asset due to partial discharge occurrences.

FIG. 4 is a simplified block diagram illustrating aspects of the present invention implemented by microprocessor 114 and/or detection circuitry 112 shown in FIG. 2 and FIG. 3. Raw data is optionally decimated 202 and compared 204 to a baseline. Positive differences from the comparison are accumulated 206, decayed 208, and observed 210 as an output indicative of asset health or damage.

Figure 5:
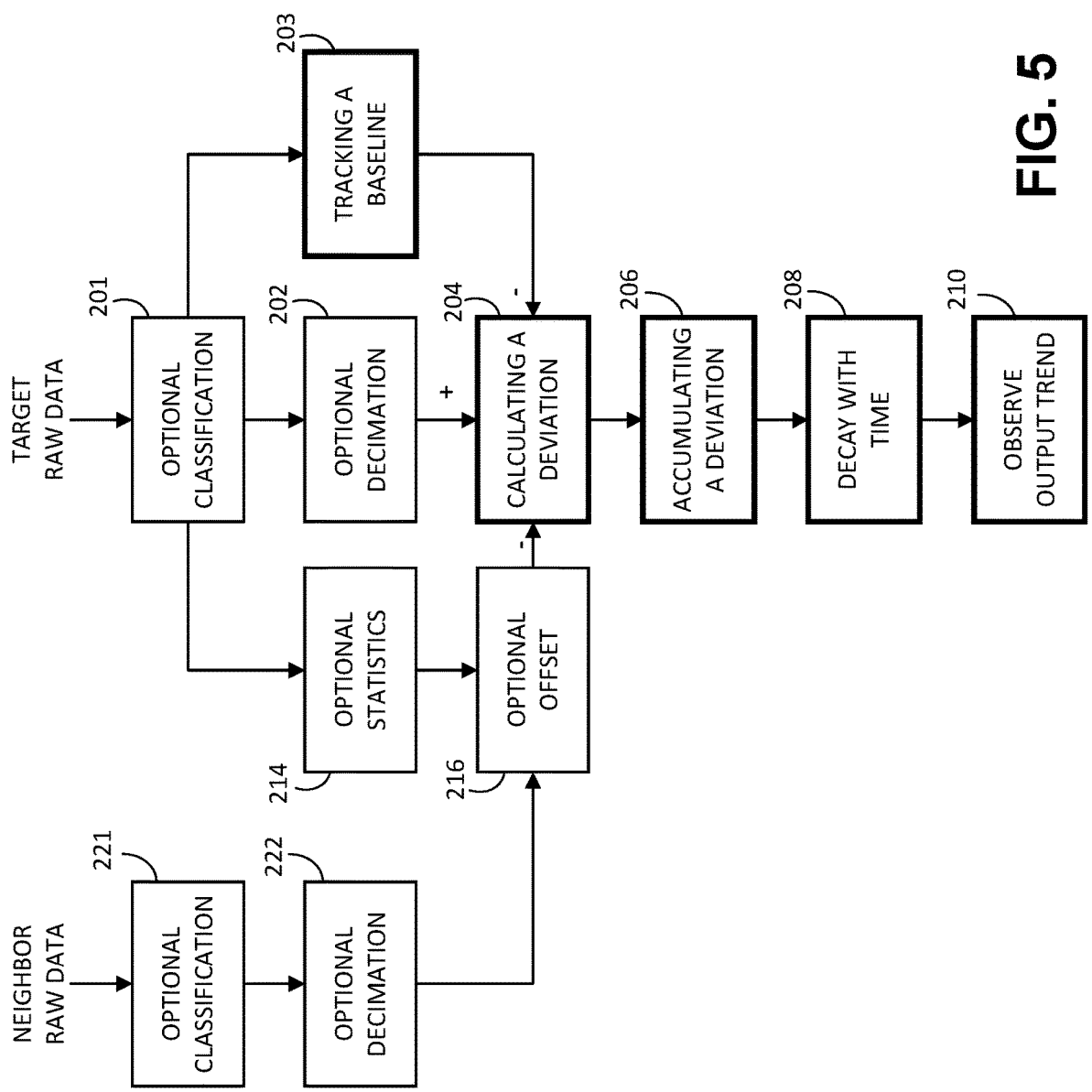
FIG. 5 is a simplified block diagram showing additional example steps used in determining changes in condition of an electrical asset due to partial discharge occurrences.

FIG. 5 is an expanded block diagram illustrating optional aspects of the present invention. As illustrated in FIG. 5, raw data, for example, from detector 110 shown in FIG. 2 or as an output of the optional classification process, 201, is provided to an optional decimation function 202. The decimation function 202, as well as other steps set forth with respect to FIG. 4, may be implemented in accordance with techniques described herein. At block 202, the output from the classification is optionally decimated. In calculation process 204 the decimation function is compared to a baseline 203 and an optional offset 216. The baseline comparison calculating a deviation 204 may occur before, or after decimation 202 as desired. At block 206, sample events are accumulated as discussed above. A decay or dissipation function 208 is provided which reduces the accumulated value through an aging mechanism. At block 210, trends in the accumulated values are observed and correlated with changes in the condition of the equipment due to the occurrence of partial discharges. An output is then provided, for example, using output circuitry 118. This output can be an alert that a failure is impending, that the equipment has degraded below a desired threshold, that the equipment has completely failed, or some other indication related to the detected partial discharge occurrences. In an exemplary case, the process of classification populates registers that are externally accessible, for example using a control system protocol such as MODBUS, DNP-3, or IEC 61850 and the process of decimation periodically samples these registers. While the immediate value of the trend function signifies the relative health of the asset, the rate of increase of the trend function signals the urgency with which repairs must be scheduled.

FIG. 5 also shows optional offset 216 including a term from optional statistics 214, such as the standard deviation of the raw data. Finally, optional offset 216 may include optionally decimated 222 data from optionally classified 221 raw data from optional detection circuits 212a and 212c, indicating neighboring asset raw data, such that the output 210 is responsive only to signals in the target asset that exceed some proportion of the signals in neighboring assets.

Although the present invention has been described with reference to exemplary and preferred embodiments, workers skilled in the art will recognize that changes may be made in form and detail without departing from the spirit and scope of the invention. The transducers 110 may be in accordance with any technology including radio frequency signals, optical sensors, sonic and ultrasonic sensors, or other types. Any number of transducers may be employed and positioned internally and/or externally to cabinetry of the asset being monitored. The transducers may be monitored continuously or may be polled. Although illustrated in the Figures as individual components, the detection circuitry and microprocessor may be implemented in a single microprocessor, as separate cores in a field programmable gate array, etc. Further, the function of acquiring and classifying partial discharge events may occur in a separate apparatus from the process of decimation, comparison, accumulation, and dissipation of a trend function. For example, a first instrument may be embedded into the electrical asset to perform acquisition, detection, and classification and the second instrument may be located in a data center, connected to the first through the internet. The microprocessor 114 is one example of a controller. Additional sensors such as temperature sensors may be employed and used to further refine the partial discharge detection system. A trending function is provided that offers rapid response to accelerating PD levels, smooth variation despite chaotic raw data, and the ability to be archived as undersampled, compressed data. The trending function can be further refined and long-term trend sets on multiple assets classes can be collected. Multi-variate, hybrid trend values for other critical asset health signatures may also be collected. The invention has utility beyond partial discharge and may be employed to track accumulated damage from other measurable abnormal conditions in an asset. These could include thermal events. While an important aspect of the invention is to obtain a smoothly varying signal related to damage from a chaotic source signal, the steps of detecting and accumulating a normalized positive difference between an asset parameter and the parameter's baseline can be used with other asset parameters and derived values. As used herein, processing circuitry can be implemented using any appropriate technique including a digital signal processor, microprocessor 114, detection circuitry 112, etc.

In various aspects, the invention may include decimation including filtering out large events in the transducer output which have a short duration; normalizing a deviation; compensating the accumulated deviations for a variable time scale; pausing detecting when the electrical component is not in use; pausing detecting when partial discharge is induced for built in self-test; using built-in self-test to establish normalization; using the baseline to establish normalization; using statistical parameters of the raw data to establish a normalization; suppressing false positives before baseline is established; deducing the accumulated damage from the value of the output; identifying critical damage from the rate of increase of the output; combining one or more signals to create an aggregate data set; classifying the input signal into a category by pattern recognition; classifying internal PD; classifying corona or surface discharge; using unclassified patterns; tracking a baseline reference value derived from the historical signal; calculating a deviation including detecting an increase in the transducer output above a baseline reference value; accumulating deviations including creating a cumulative sum of partial discharge events in the transducer output that exceed a baseline reference value; identifying new damage; and providing a higher weight to recent events in the transducer output.

What is claimed is:

1. A method of detecting damage caused by partial discharge in an electrical asset, comprising:
   sensing a signal from the electrical asset due to an occurrence of a partial discharge using a transducer and responsively providing a transducer output wherein the signal is a radio frequency signal received by the transducer caused by a partial discharge in the electrical asset;

processing the transducer output by comparing the transducer output to a baseline, calculating an accumulated amount by which the transducer output exceeds the baseline, decreasing the calculated accumulated amount with time, and detecting damage caused by partial discharge in the electrical asset based upon the calculated accumulated amount; and providing an output related to detected damage.

2. The method of claim 1 wherein processing the transducer output includes decimating the transducer output.

3. The method of claim 1 wherein processing the transducer output includes filtering out large events in the transducer output having a short duration.

4. The method of claim 1 wherein processing the transducer output includes normalizing a deviation.

5. The method of claim 1 wherein processing the transducer output includes compensating for accumulated deviations with a variable sampling time scale.

6. The method of claim 1 including pausing detecting damage when the electrical asset is not in use.

7. The method of claim 1 including performing a partial discharge self test.

8. The method of claim 7 wherein the self test is used to establish normalization.

9. The method of claim 4 including establishing normalization using the baseline.

10. The method of claim 4 including establishing the normalization using statistical parameters of the transducer output.

11. The method of claim 1 including suppressing false positives prior to calculating a deviation.

12. The method of claim 1 wherein detecting damage includes detecting accumulated damage.

13. The method of claim 1 wherein detecting damage includes detecting critical damage based upon a rate of increase in the transducer output.

14. The method of claim 1 including receiving a second signal sensed from the electrical asset and the step of processing includes combining the signal and the second signal to create an aggregate data set.

15. The method of claim 1 including recognizing a pattern in the transducer output and responsively classifying the partial discharge.

16. The method of claim 15 wherein classifying partial discharge includes classifying internal partial discharge.

17. The method of claim 15 wherein classifying includes classifying corona discharge.

18. The method of claim 1 including calculating a deviation of the transducer output by detecting an increase in the transducer output above the baseline.

19. The method of claim 1 wherein calculating an accumulated amount includes creating an accumulative sum of partial discharge events in the transducer output that exceed the baseline.

20. The method of claim 1 wherein detecting damage includes identifying new damage.

21. The method of claim 1 wherein processing the transducer output includes providing a higher weight to recent events in the transducer output.

22. The method of claim 7 including pausing detecting during the partial discharge self test.

23. The method of claim 1 including using the transducer outputs from neighboring assets to suppressing false positives.

24. The method of claim 15 wherein classifying includes classifying surface discharge.

25. A partial discharge damage detection system for detecting damage caused by partial discharge in an electrical asset, comprising:

one or more transducers configured to receive one or more signals from the electrical asset generated due to an occurrence of partial discharge in an electrical asset and responsively providing a transducer output wherein the signals are radio frequency signals received by the transducers;

processing circuitry configured to compare the transducer output to a baseline, calculate an accumulated amount by which the transducer output exceeds the baseline, decrease the calculated accumulated amount with time, and detect damage caused by partial discharge in the electrical asset based upon the calculated accumulated amount; and output circuitry configured to provide an output related to damage.

26. The partial discharge damage detection system of claim 25 wherein the processing circuitry decimates the transducer output.

27. The partial discharge damage detection system of claim 25 wherein the processing circuitry filters out large events in the transducer output having a short duration.

28. The partial discharge damage detection system of claim 25 wherein the processing circuitry normalizes a deviation.

29. The partial discharge damage detection system of claim 25 wherein the processing compensates for accumulated deviations with a variable sampling time scale.

30. The partial discharge damage detection system of claim 25 wherein the processing circuitry pauses damage detection when the electrical asset is not in use.

31. The partial discharge damage detection system of claim 25 wherein the processing circuitry performs a partial discharge self test.

32. The partial discharge damage detection system of claim 31 wherein the self test is used to establish normalization.

33. The partial discharge damage detection system of claim 25 including establishing normalization using the baseline.

34. The partial discharge damage detection system of claim 25 wherein the processing circuitry establishes a normalization using statistical parameters of the transducer output.

35. The partial discharge damage detection system of claim 25 wherein the processing circuitry suppresses false positives prior to calculating a deviation.

36. The partial discharge damage detection system of claim 25 wherein the processing circuitry detects damage includes detecting accumulated damage.

37. The partial discharge damage detection system of claim 25 wherein the processing circuitry detects critical damage based upon a rate of increase in the transducer output.

38. The partial discharge damage detection system of claim 25 wherein the processing circuitry receives a second signal sensed from the electrical asset and combines the signal and the second signal to create an aggregate data set.

39. The partial discharge damage detection system of claim 25 wherein the processing circuitry recognizes a pattern in the transducer output and responsively classifies the partial discharge.

40. The partial discharge damage detection system of claim 25 wherein the processing circuitry calculates a deviation of the transducer output by detecting an increase in the transducer output above the baseline.

41. The partial discharge damage detection system of claim 25 wherein the processing circuitry calculates an accumulated amount by creating an accumulative sum of partial discharge events in the transducer output that exceed the baseline.

42. The partial discharge damage detection system of claim 25 wherein the processing circuitry identifies new damage in the electrical asset.

43. The partial discharge damage detection system of claim 25 wherein the processing circuitry provides a higher weight to recent events in the transducer output.

44. The partial discharge damage detection system of claim 31 including pausing detecting during the partial discharge self test.

45. The partial damage detection system of claim 25 including using the transducer outputs from neighboring assets to suppressing false positives.

46. The partial discharge damage detection system of claim 25 wherein classifying partial discharge includes classifying internal partial discharge.

47. The partial discharge damage detection system of claim 25 wherein classifying includes classifying corona discharge.

48. The partial discharge damage detection system of claim 25 wherein classifying includes classifying surface discharge.

49. The partial discharge damage detection system of claim 25 wherein the processing circuitry compares the transducer output with a transducer output from a neighboring electrical asset during a self test.

50. The partial discharge damage detection system of claim 25 wherein the processing circuitry reduces crosstalk in the transducer output from a neighboring electrical asset.

51. The partial discharge damage detection system of claim 25 including a calibrator for use in a self test which simulates a partial discharge event.

52. The partial discharge damage detection system of claim 51 wherein the transducer output during the self test is not included in the accumulated amount of time.

53. The partial discharge damage detection system of claim 31 wherein the processing circuitry pauses damage detection during the partial discharge self test.

* * * * *